Figure 1:
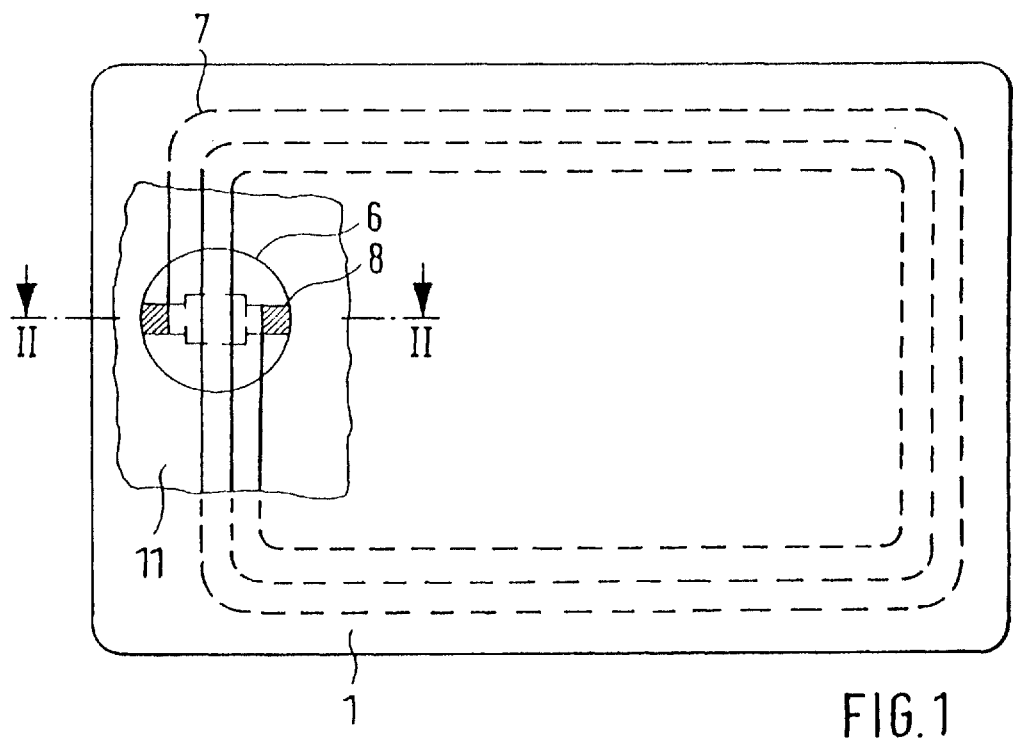

United States Patent
Haghiri-Tehrani

[11] Patent Number: 5,880,934
[45] Date of Patent: Mar. 9, 1999

[54] DATA CARRIER HAVING SEPARATELY PROVIDED INTEGRATED CIRCUIT AND INDUCTION COIL

[75] Inventor: Yahya Haghiri-Tehrani, Munich, Germany

[73] Assignee: Giesecke & Devrient GmbH, Munich, Germany

[21] Appl. No.: 960,500

[22] Filed: Oct. 29, 1997

Related U.S. Application Data

[63] Continuation of Ser. No. 437,388, May 11, 1995, abandoned.

[30] Foreign Application Priority Data

May 11, 1994 [DE] Germany ............... 44 16 697.4

[51] Int. Cl.[6] .................... H05K 1/11; H05K 1/14
[52] U.S. Cl. .................. 361/737; 235/492; 257/679; 361/809; 361/820
[58] Field of Search ............... 235/487, 488, 235/492, 449, 451, 441, 491; 257/678, 679; 361/737, 761, 782, 813, 811, 821, 764, 807, 809, 820; 340/825.44; 455/269; 156/267, 252, 300, 297

[56] References Cited

U.S. PATENT DOCUMENTS

| | | |
|---|---|---|
| 4,795,898 | 1/1989 | Bernstein et al. ............... 235/487 |
| 4,868,373 | 9/1989 | Opheij et al. ............... 235/492 |
| 4,999,742 | 3/1991 | Stampfli . |
| 5,321,240 | 6/1994 | Takahira ............... 235/492 |
| 5,361,061 | 11/1994 | Mays et al. ............... 455/269 |
| 5,399,847 | 3/1995 | Droz ............... 235/488 |
| 5,428,214 | 6/1995 | Hakkers et al. ............... 235/492 |
| 5,514,240 | 5/1996 | Haghiri-Tehrani ............... 257/679 |
| 5,519,201 | 5/1996 | Templeton, Jr. et al. ............... 235/492 |
| 5,544,014 | 8/1996 | Atsumi ............... 361/737 |
| 5,598,032 | 1/1997 | Fidalgo ............... 257/679 |
| 5,606,488 | 2/1997 | Gustafson ............... 361/737 |
| 5,690,773 | 11/1997 | Fidalgo et al. ............... 257/679 |

*Primary Examiner*—Donald Sparks
*Attorney, Agent, or Firm*—Stevens, Davis, Miller & Mosher, L.L.P.

[57] ABSTRACT

The invention relates to a data carrier comprising a card body and an integrated circuit connected electroconductively via contact elements with at least one coil serving the purpose of power supply and/or data exchange of the integrated circuit with external devices. The invention is characterized in that the integrated circuit and the contact elements form a separate module known in the art and the coil is disposed on a card body constructed from one or more layers in known fashion. The coil is preferably formed as a flat coil.

13 Claims, 3 Drawing Sheets

DATA CARRIER HAVING SEPARATELY PROVIDED INTEGRATED CIRCUIT AND INDUCTION COIL

This application is a continuation of application Ser. No. 08/437,388, filed on May 11, 1995, (abandoned).

This invention relates to a data carrier according to the preamble of claim 1. The invention also relates to a method for producing a data carrier.

Data carriers with integrated circuits are used in the form of credit cards, bank cards, cash payment cards and the like in a great variety of services sectors, for example in cashless money transfer or in the intra-company area as access authorization. With a great number of these data carriers, power is supplied and/or data exchanged with external devices in contacting fashion via the outer contact surfaces of an electronic module. Since the contact surfaces for connecting the data carriers to a reading/writing device are exposed in these prior art data carriers there is a danger of the contact surfaces being soiled, which may lead to poor contacting and thus faulty data transmission between the data carrier and the corresponding reading/writing device of the terminal. Regardless of that, faulty data transmission can also occur due to faulty positioning of the contact surfaces in the reading/writing device of the terminal. To avoid the abovementioned disadvantages data carriers with contactless, e.g. inductive, coupling are already known from the prior art.

EP-A1 0 376 062 discloses e.g. an electronic module and a method for producing the module. The known module contains an insulating carrier film and a chip with an integrated circuit which has at least two interconnecting leads and is disposed on the carrier film. On the same side of the carrier film of the module there is a coil. The coil, which is part of the module, permits inductive coupling between the module and an external device. The coil is executed as a ring-shaped, wire-wrapped coil surrounding a space which completely houses the chip and the elements electroconductively connecting the leads of the chip with the leads of the coil, and is subsequently filled with an electrically insulating and hardened viscous compound. After its completion the known module is installed in a card, the coil guaranteeing effective protection of the chip and the electroconductive connecting elements against stresses to which this card is exposed during use.

While the arrangement of the coil on the module provides good protection for the chip, this specific structure of a module means that specially constructed modules must be used for producing a data carrier with contactless coupling. This has the disadvantage that a special method is required or specific tools must be provided for producing the modules. Furthermore, owing to the special production of these modules conventional ones, i.e. modules without a coil, cannot be used for producing a data carrier with contactless coupling. Finally, high costs can arise with small runs of data carriers with contactless coupling with a specially produced module, since the latter must be manufactured separately. All this means that these special modules impair the flexibility of producing data carriers with contactless coupling.

The invention is thus based on the problem of proposing a data carrier with contactless coupling which is easier to produce.

This problem is solved by the features stated in the independent claims.

The basic idea of the invention is to decouple module and coil, whereby the module can be produced separately in known fashion and the coil is manufactured independently of the module and applied to a layer of the card body.

The coil can be disposed for example on a cover layer or on an inner layer of a multilayer card body or on an injection molded card body part. The coil can be printed on the card body layer e.g. in wire-wrapped form or else as an electroconductive layer by the screen printing method e.g. by means of an electroconductive adhesive. The coil can alternatively be punched out of a metal foil or etched out of an electroconductively coated plastic film and glued to the card body layer. Further it is also possible for the coil to be stamped in the card body layer in the form of an electroconductive layer by the hot stamping method. The coil is preferably formed as a flat coil, the leads of the coil and the contact elements of the module being standardized with respect to location and position in the card body in relation to each another, for example disposed directly opposite each other, thereby permitting a simple electroconductive connection to be established between the leads of the coil and those of the module. This can be done for example with the help of an electroconductive adhesive or else by means of soldering or other common techniques familiar to the expert. Finally it is noted that the module can also be executed as a hybrid module which additionally has outer contact surfaces for contacting coupling with external devices.

The advantages achieved with the invention consist in particular in that one can use the modules produced in conventional fashion, i.e. modules without coils, thereby giving more flexibility to the production of data carriers with contactless coupling. This necessitates no great change in previous module production, requiring no special new tools or new method for producing the modules. Furthermore, due to the arrangement of the coil on a card body layer the invention also permits high flexibility in designing the coil, for example in terms of the required inductance, e.g. the number of turns, active coil surface, wire diameter, etc., and also high flexibility in selecting the technology for realizing the coil on the card body layer. Furthermore, the invention permits simple connection of the module with the coil, in particular when the coil leads and the contact elements of the module which are electrically connected with the coil leads are standardized in terms of location and position in the card body. Also, the structure of the module can be chosen freely including the location and position of the contact elements; for example the contact elements of the module can be obtained from an electroconductively coated carrier film or punched out of a metal band by the lead frame technique. The integrated circuit can be glued to a central area of the punched lead frame here e.g. with the help of an adhesive. The electroconductive connection of the integrated circuit with the contact elements of the module can be effected e.g. in known fashion by the wire-bonding or the so-called TAB technique. These techniques and the different designs of the modules in this connection are familiar to the expert.

Further properties and advantages of the invention will result from the following description of different embodiment examples, which are explained more closely with reference to the drawings.

Figure 2:
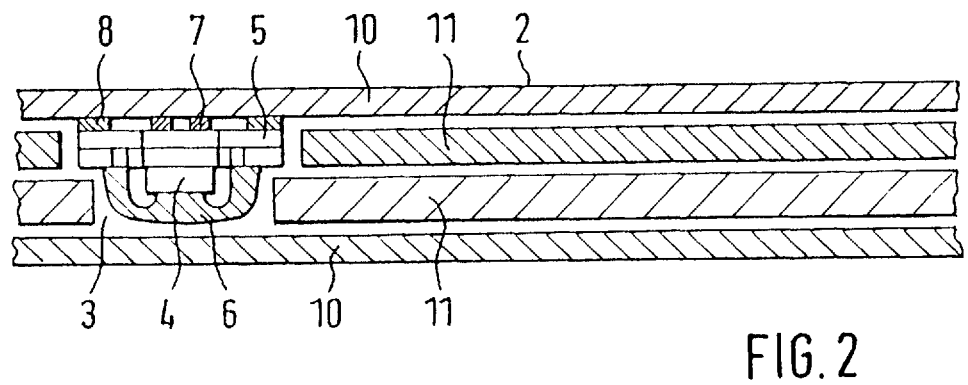
Figure 3:
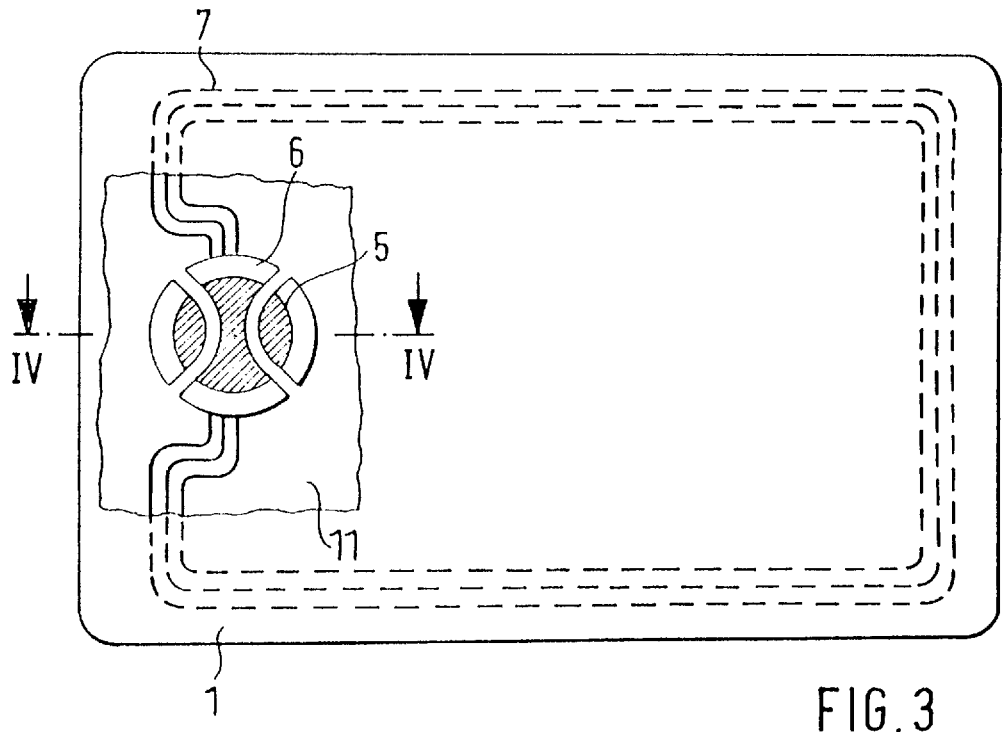
Figure 4:
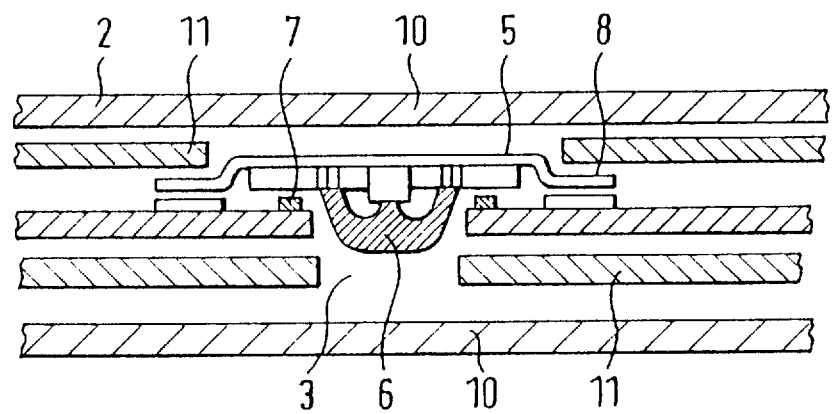
Figure 5:
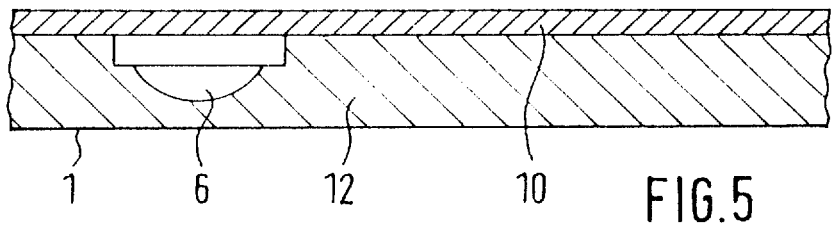
Figure 6:
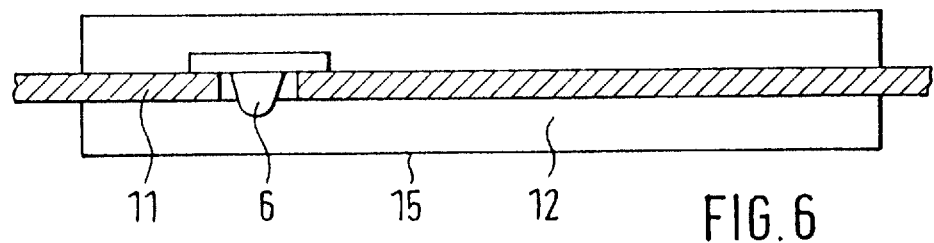
Figure 7:
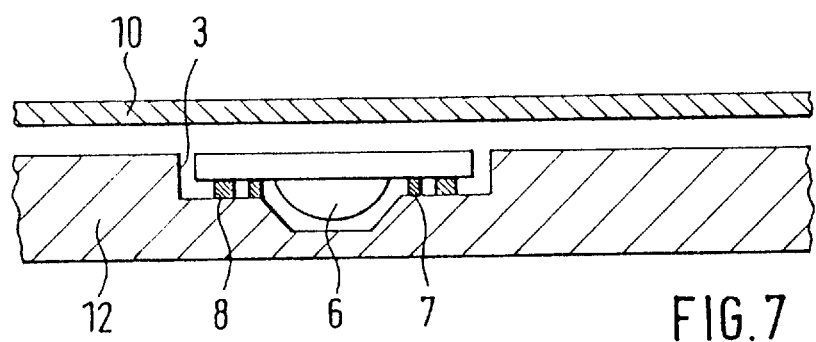
Figure 8:
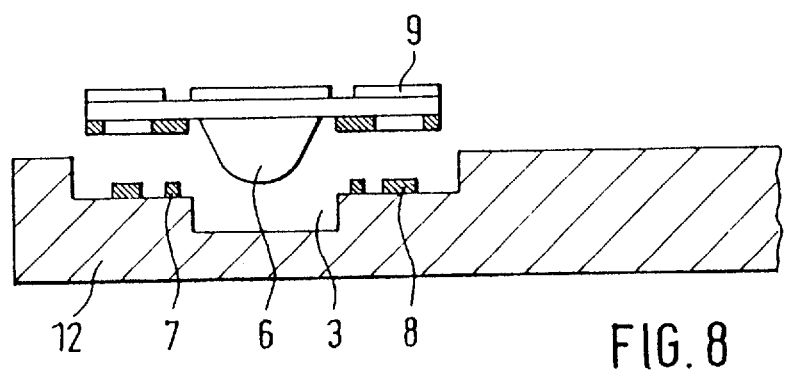

Further embodiments and advantages of the invention will result from the subclaims as well as the drawings, in which:

FIG. 1 shows a data carrier in plan view, the module and a part of the coil being shown as a detail without the upper cover layer, FIG. 2 shows the detail of the data carrier according to FIG. 1 in a sectional view, FIG. 3 shows the plan view of a further embodiment example of a data carrier, the module and a part of the coil being shown as a detail, FIG. 4 shows the detail of the data carrier according to FIG. 3 in a sectional view, FIG. 5 shows a further embodiment example with an injection molded card body part, FIG. 6 shows an injection mold with an inserted card inlay, FIG. 7 shows a hybrid module and a card body part with a coil, FIG. 8 shows a contactless module with the corresponding card body part and coil.

FIG. 1 shows data carrier 1 comprising card body 2 with coil 7 disposed thereon and connected electroconductively with module 6.

FIG. 2 shows enlarged and not true to scale a cross section along the broken line in FIG. 1 within the detail which includes the module, a part of the card body and the coil. Module 6 includes at least one integrated circuit 4 with two leads which are connected electroconductively with contact elements 5 of the module. The module shown in FIG. 2 consists e.g. of a Kapton carrier film which has contact elements 5 on one side. The carrier film has in known fashion accordingly positioned windows for receiving the integrated circuit and for guiding through the conductor wires from the circuit to the contact elements. For protection from mechanical loads the integrated circuit and conductor wires can be cast with a casting compound. In the embodiment example of a module shown here, the contact elements are applied to the carrier film as an electroconductive coating, then being connected e.g. by wire-bonding with the leads of the integrated circuit.

The data carrier shown in FIG. 2 is produced e.g. by the laminating technique familiar to the expert, whereby the separately produced module without a coil is laminated into a multilayer card body. Multilayer card body 2 includes upper and lower cover layers 10 as well as at least one inner card layer 11 having suitable opening 3 for receiving the module. The outside surfaces of cover layers 10 are generally provided with a print. On one of the inner surfaces of cover layers 10, in this embodiment example the upper cover layer, there is coil 7 which forms a semi-finished product with card body layer 10. Coil leads 8 are positioned so as to be disposed directly opposite contact elements 5 of module 6. This allows simple electroconductive connection of the contact elements with the coil leads. The electroconductive connection can be achieved e.g. with the help of an electroconductive adhesive. Coil 7 can e.g. be printed on a card body layer by the screen printing method by means of an electroconductive adhesive or be applied to the card body layer in the form of an electroconductive coating by the hot stamping method. Alternatively, coil 7 can also be punched out of a metal foil or an electroconductively coated plastic film and be disposed on a layer of the card body. The coil can also be fastened to the card body layer as a finished wire-wrapped coil without a core, e.g. with the help of an adhesive.

FIGS. 3 and 4 show a further embodiment example of data carrier 1. It differs from that in FIG. 2 essentially only in that coil 7 is disposed on inner layer 11 of card body 2. This inner layer of the card body likewise has suitable opening 3 for receiving module 6. Contact elements 5 of the module are preferably elbowed in this embodiment, which allows a simple realization of the electroconductive connection with leads 8 of the coil. This embodiment has the advantage that inner layers 11, which form the card inlay of the data carrier, can be prepared independently of the printing operation of cover layers 10 of the data carrier for mounting coil and module. In the embodiment examples described up to now, the data carrier was preferably produced by the laminating technique. Of course other techniques can also be applied, for example injection molding or the mounting approach. These techniques are familiar to the expert and will thus be explained only briefly in the following embodiment examples.

FIG. 5 shows a greatly schematized view of the semi-finished product already shown in cross section in FIG. 2, which includes card body layer 10 with coil 7 disposed thereon whose leads are electrically connected with the contact elements of module 6. This semi-finished product can also be mounted e.g. on injection molded card body part 12, which is provided with a suitable recess for receiving the module, and be connected with the card body part in known fashion.

FIG. 6 shows a greatly schematized view of card inlay 11 with module 6 and coil 7 already shown in FIG. 4. This separately produced semi-finished product can also be further processed e.g. by injection molding. For this purpose the card inlay with module and coil is introduced into injection mold 15 in known fashion and molded with a plastic material which then forms card body part 12.

FIG. 7 shows a schematized view of injection molded card body part 12 with two-step recess 3, leads 8 of coil 7 being disposed in freely accessible fashion on the shoulder areas of the recess. Module 6 can thus be installed in recess 3 of card body part 12 in simple fashion for example by the known mounting approach, it being easy to realize the electroconductive connection of the coil leads with the contact elements of the module. Subsequently, printed cover layer 10 can be connected with injection molded card body part 12 for example with the help of an adhesive layer.

FIG. 8 shows hybrid module 6 which has, in addition to coil 7, outer contact surfaces 9 serving the purpose of contacting power supply and/or data exchange. Hybrid module 6 can likewise be installed in specially provided recess 3 of injection molded card body part 12 in simple fashion by the known mounting approach. For mounting the module one can use for example a contact adhesive layer or a thermally activated adhesive layer. The application of a printed cover layer as shown in FIG. 7 can be omitted here, since the desired printed image is already taken into account during injection molding of the card body. In this case the card body consists of only one layer.

I claim:

1. A data carrier having a body comprising:
   at least one layer;
   an integrated circuit; and
   at least one coil having leads integrally formed with the coil and forming part of the body; characterized in that:
   a module bearing the integrated circuit and at least two contact elements is electrically connected via said contact elements with the leads of the coil;
   the module and the layer of the body are provided separately;
   the module further comprises outer contact surfaces;
   the body has a two-step recess for receiving the module, the two-step recess having a first step and a second step which is deeper than the first step; and
   the coil is disposed on the first step.

2. The data carrier of claim 1, characterized in that the at least one layer of the body comprises a cover layer.

3. The data carrier of claim 1, characterized in that the at least one layer of the body comprises an insulating layer and in that the coil is formed as a flat coil which is glued to the insulating layer of the body as a finished wire-wrapped coil.

4. The data carrier of claim 1, characterized in that the coil extends essentially over an entire surface of the body.

5. The data carrier of claim 1, characterized in that the leads of the coil and the contact elements of the module are disposed opposite each other within a plane of the body.

6. The data carrier of claim 5, characterized in that the leads of the coil are glued electroconductively to the contact elements of the module.

7. The data carrier of claim 1, characterized in that the at least one layer of the body comprises an inner layer of the body.

8. The data carrier of claim 1, characterized in that the at least one layer of the body comprises an injection molded body part.

9. The data carrier of claim 1, characterized in that the at least one layer of the body comprises an insulating layer of the body and in that the coil is printed on the insulating layer of the body as an electroconductive layer.

10. The data carrier of claim 1, characterized in that the coil is stamped in a layer of the at least one layer of the body by a hot stamping method.

11. The data carrier of claim 1, characterized in that the coil is punched out of a metal foil and disposed on a layer of the at least one layer of the body.

12. The data carrier of claim 1, characterized in that the coil is punched out of an electroconductively coated plastic film and disposed on a layer of the at least one layer of the body.

13. The data carrier of claim 1, characterized in that said body consists of one layer.

* * * * *